United States Patent
Valiani et al.

(10) Patent No.: US 9,031,182 B2
(45) Date of Patent: May 12, 2015

(54) METHOD AND CIRCUIT FOR CLOCK RECOVERY OF A DATA STREAM DESCRIPTION

(71) Applicant: Power-One Italy S.p.A, Terranuova, Bracciolini (IT)

(72) Inventors: Massimo Valiani, Corciano (IT); Davide Tazzari, Loro Ciuffenna (IT); Filippo Vernia, La Spezia (IT)

(73) Assignee: Power-One Italy S.p.A., Terranuova Bracciolini, Arezzo (IT)

( * ) Notice: Subject to any disclaimer, the term of this patent is extended or adjusted under 35 U.S.C. 154(b) by 0 days.

(21) Appl. No.: 13/897,731

(22) Filed: May 20, 2013

(65) Prior Publication Data

US 2014/0023169 A1   Jan. 23, 2014

(30) Foreign Application Priority Data

Nov. 23, 2010  (WO) .................. PCT/IT2010/000468

(51) Int. Cl.
  *H03D 3/24*  (2006.01)
  *H04L 7/033*  (2006.01)
  *H03L 7/08*  (2006.01)
  *H03L 7/093*  (2006.01)

(52) U.S. Cl.
  CPC ............ *H04L 7/0331* (2013.01); *H04L 7/0334* (2013.01); *H03L 7/0807* (2013.01); *H03L 7/093* (2013.01); *H03L 2207/50* (2013.01)

(58) Field of Classification Search
  CPC .. H03K 5/135; H03L 2207/50; H03L 7/0807; H03L 7/091; H04L 7/0331; H04L 7/0334
  USPC ..................... 327/2, 94; 375/373, 375, 376
  See application file for complete search history.

(56) References Cited

U.S. PATENT DOCUMENTS

| | | | | |
|---|---|---|---|---|
| 4,577,241 | A * | 3/1986 | Wilkinson .................... | 386/204 |
| 5,850,422 | A * | 12/1998 | Chen ............................ | 375/371 |
| 8,249,207 | B1* | 8/2012 | Hissen et al. ................. | 375/355 |
| 2002/0159556 | A1* | 10/2002 | Kishine et al. ................ | 375/376 |
| 2002/0186159 | A1* | 12/2002 | Reinhold et al. .............. | 341/155 |
| 2004/0218705 | A1* | 11/2004 | Cranford et al. ............. | 375/355 |
| 2005/0058235 | A1* | 3/2005 | Beeson et al. ................ | 375/376 |
| 2007/0036257 | A1* | 2/2007 | Hu ................................ | 375/376 |
| 2007/0286321 | A1* | 12/2007 | Gupta et al. .................. | 375/375 |

OTHER PUBLICATIONS

Hogge, C.R., Jr., "A self correcting clock recovery circuit," Electron Devices, IEEE Transactions on, vol. 32, No. 12, pp. 2704,2706, Dec. 1985.*

(Continued)

*Primary Examiner* — Daniel Washburn
*Assistant Examiner* — Amneet Singh
(74) *Attorney, Agent, or Firm* — Patterson Intellectual Property Law, P.C.; Mark J. Patterson

(57) ABSTRACT

A method for clock recovery and data recovery from a data stream on a communication channel includes sampling a data stream on the communication channel at a sampling frequency determined by a clock signal and generating a sampled signal. The method further includes determining a phase shift between the communication data stream and the sampled signal and modifying the phase of the clock signal on the basis of the phase shift to obtain a desired phase difference between the sampled signal and the data stream.

17 Claims, 4 Drawing Sheets

(56) References Cited

OTHER PUBLICATIONS

Ishihara, N.; Akazawa, Yukio, "A monolithic 156 Mb/s clock and data recovery PLL circuit using the sample-and-hold technique," Solid-State Circuits, IEEE Journal of, vol. 29, No. 12, pp. 1566,1571, Dec. 1994.*

Hogge C.R.: "A Self Correcting Clock Recovery Circuit", Journal of Lightwave Technology, IEEE Service Center, New York, NY, US, vol. LT-3, No. 6, Dec. 1, 1985, pp. 1312-1314, XP000560659, ISSN: 0733-8724 figures 1,2.

International Search Report for PCT/IT2010/000468, mailed May 9, 2011.

International Application No. PCT/IT2010/000468, filed on Nov. 23, 2010.

* cited by examiner

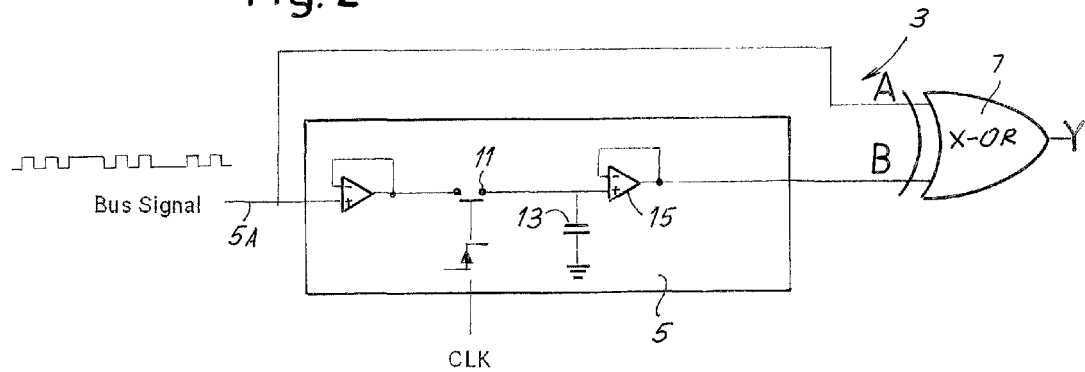
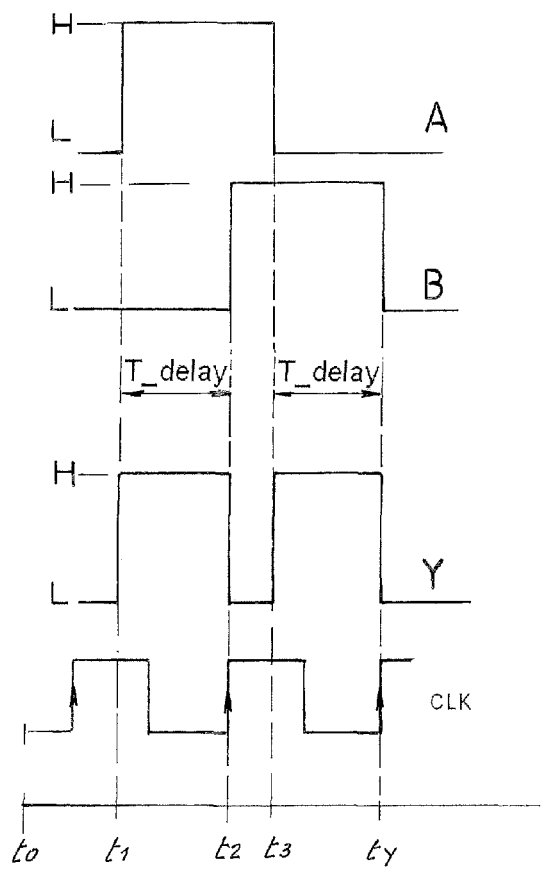
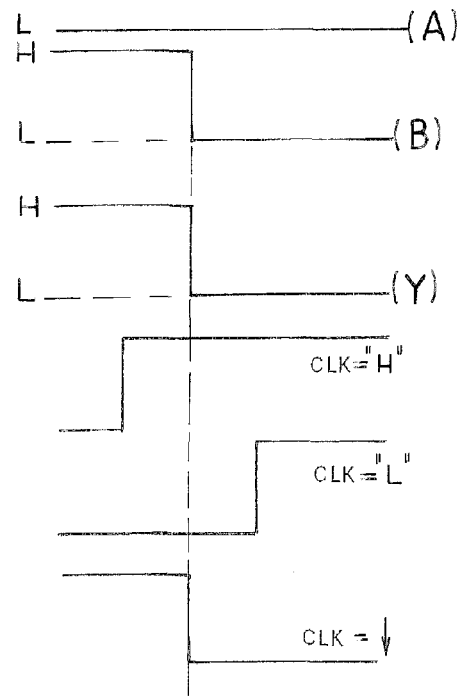

METHOD AND CIRCUIT FOR CLOCK RECOVERY OF A DATA STREAM

DESCRIPTION

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of International Patent Application No. PCT/IT2010/000468 filed Nov. 23, 2010, the entire content of which is incorporated herein by reference.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates to a method and a circuit for clock recovery and data recovery from a data stream such as a data stream on a communication channel.

In communications between several devices connected to a communication channel, information and data are transmitted in the form of a data stream constituted by an alternation of values of a quantity between two or more levels. Typically, in digital transmission the communication signal alternatively takes two values (high and low, or "0" and "1") with a given frequency. In general, the communication channel can be a bus on which transmission takes place through electrical signals, an optical channel on which transmission takes place by means of optical pulses, a radio channel, etc.

Transmission takes place at high speed through a sequence of high and low values (0 and 1) according to a transmission protocol. Some transmission modes, called "synchronous transmissions" require that the data bus is combined with an auxiliary communication line where the clock signal is transmitted. Devices connected to the transmission line use the line dedicated to the clock signal to synchronize their transmission and reception and to correctly interpret the main data stream. This technique is very robust but has the intrinsic disadvantage of requiring an additional line for the clock which in fact does not transmit important information. Other transmission modes, called "asynchronous transmissions", do not require the presence of an auxiliary line for the clock signal. For these transmission modes, the clock signal must be recovered. Various techniques are adopted for clock recovery. The most common techniques are based on high speed sampling of the signal on the bus and subsequent decimation. Other techniques are based on phase locking of the signal on the communication channel by means of PLL (Phase Lock Loop) circuits, where a dummy clock signal generated internally by the devices that participate in communication is phased with the signal circulating in the communication channel. In this last process the data stream transmitted on the channel, is required to present a transition between at least two levels to correct any drift errors of the oscillator of the PLL circuit. An example of a clock recovery system is described in U.S. Patent Publication No. 2004/0146131.

BRIEF SUMMARY OF THE INVENTION

According to one aspect, the present invention relates to a clock recovery and data recovery method that is particularly efficient and that can also be implemented with limited resources in a digital environment.

An object of an embodiment of the invention is to provide a clock and data recovery method that is robust and has high noise immunity. Another object of embodiments of the invention is to provide a method that can operate at a low frequency, thereby limiting computational burdens.

According to a further aspect, an embodiment of the invention relates to a PLL circuit for clock and data recovery which is low cost and can be implemented with devices also having low MIPS (Million Instructions per Second), i.e. with low calculation capacity.

According to a further aspect, an embodiment of the invention may use a particularly efficient phase detector circuit suitable to be used in a clock and data recovery PLL circuit.

According to a first aspect, an embodiment of the invention relates to a method for clock recovery and data recovery of a data stream on a communication channel. The method may include: sampling a data stream on the communication channel, characterized by transitions between at least two levels (for example, two voltage values) at a sampling frequency determined by a clock signal and generating a sampled signal; determining a phase shift between the data stream on the communication channel a and the sampled signal; and modifying the phase of the clock signal on the basis of the phase shift to obtain a desired phase difference between the sampled signal and the data stream on the transmission channel.

In practice, for clock and data recovery from a data stream transmitted in serial mode on the transmission channel, a sampling frequency is set as a function of the transmission frequency on the communication channel. The data on the communication channel are sampled with a sample-and-hold circuit controlled by a clock signal with a phase that is locked to the phase of the data stream—on the channel by means of a PLL.

In a practical embodiment, the data stream on the communication channel may be sampled at a predetermined point of the clock signal, preferably at the rising edge of the clock signal.

In some embodiments, the method according to the present invention may include an initial step of determining the data stream transmission frequency, to set the frequency of the clock signal to a value equal to or greater than the transmission frequency, typically to a frequency equal to the data transmission frequency on the communication channel.

In some embodiments, the phase shift between the sampled signal and the data stream is determined by applying the sampled signal and the data stream to two inputs of a phase comparator that supplies an output phase shift signal. According to one embodiment of the invention, the phase comparator is obtained with a digital circuit, advantageously through logic gates, for example, and preferably through an exclusive OR (X-OR) logic gate. In other embodiments the phase comparator can be obtained with a flip-flop circuit.

The clock signal generated by an oscillator, such as a digital phase-controlled oscillator, can advantageously be controlled so that the phase thereof is modified as a function of the phase shift signal obtained from the phase comparator. Time information can be obtained from the phase shift signal, i.e. a datum indicating the duration of the phase shift signal. This value, which can be obtained, for example, with a free running timer, is preferably subjected to a translation operation and if necessary to a filtering operation and the translated and modified time signal constitutes the input of a compensator, typically, for example, a proportional-integral compensator. The output signal of the compensator constitutes the control value of the oscillator. The signal can converge toward a value equal to zero, when a recovered signal in phase with the signal on the bus is requested. In other embodiments, the compensator can be set to make the phase shift between bus signal and recovered signal converge toward a value different from zero, typically equal to half of the clock signal period. In this way, sampling of the bus signal is performed in the middle of each bit transmitted, to the advantage of immunity to noise and electrical nonlinearities of the transmission channel.

Further characteristics of embodiments of the method according to the invention are indicated in the claims and will be described in greater detail below with reference to an embodiment.

According to another aspect, embodiments of the invention relate to a phase detector circuit having: an input for a data stream at a communication frequency; a sample-and-hold circuit controlled by a sampling signal with a sampling frequency; and a phase comparator with a first input to which the data stream is applied and a second input to which the sampled signal is applied, the output of the phase comparator being a function of the phase difference between the data stream and the sampled signal.

According to yet another aspect, the invention relates to a circuit for clock recovery and data recovery from a data stream on a communication channel, comprising a PLL circuit with a detector of the type defined above.

Further embodiments and advantageous features of the phase detector circuit and of the PLL circuit according to the invention are defined in the claims and will be described below with reference to an embodiment.

BRIEF DESCRIPTION OF THE SEVERAL VIEWS OF THE DRAWINGS

The invention will now be better understood by following the description and accompanying drawing, which shows a non-limiting practical embodiment of the invention.

FIG. 2 is a block diagram of the phase detector circuit according to an embodiment of the invention.

FIG. 3 shows waveforms of the signals in the phase detector circuit of FIG. 2 where it is intended that the digital sample-and-hold operation is performed on the rising edge of the clock signal CLK.

FIG. 4 shows a diagram illustrating a property of the phase detector circuit of FIG. 2.

DETAILED DESCRIPTION OF THE INVENTION

Figure 1:
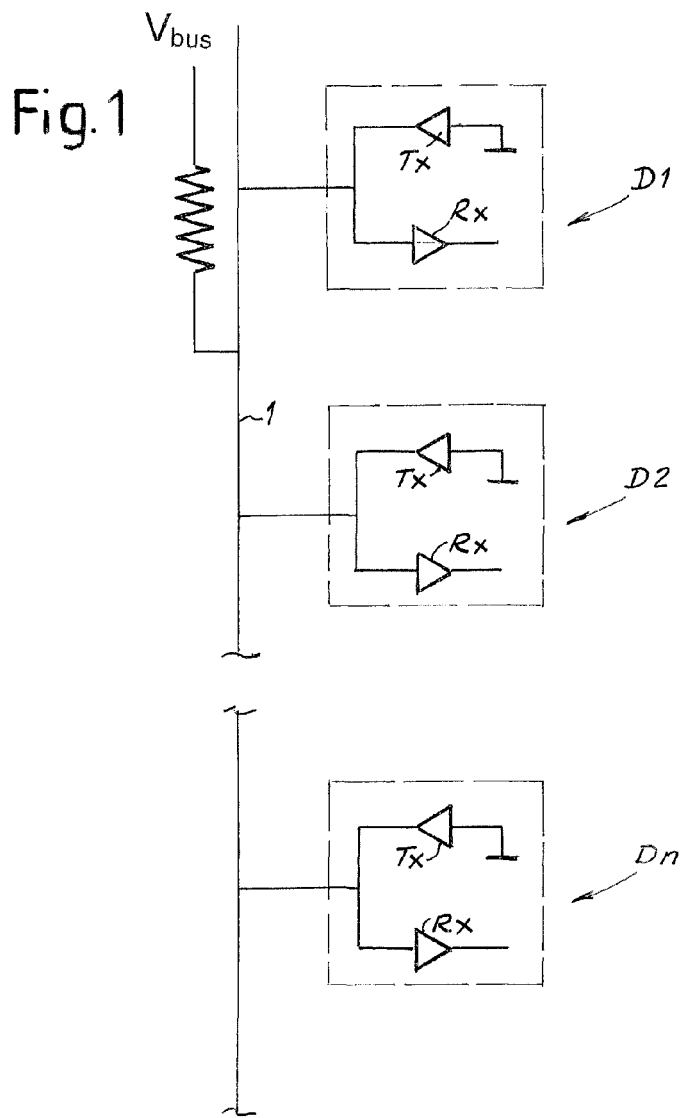
FIG. 1 schematically shows a communication channel to which devices that must communicate on the channel are connected.

FIG. 1 shows a diagram of a generic communication channel 1 on which devices D1, D2, ... Dn are connected. The communication channel can, for example, be a communication bus on which there can be present a voltage that is subjected to a series of transitions between a high value ("Vbus") and a low value ("gnd") to generate information bits that are transmitted over the communication bus. Voltage modulation on the bus is determined by the transmission of data by the devices D1, D2, ... Dn according to a protocol, whose structure is not important in order to understand the present invention and can be any. The only thing that is important is that a data stream containing a plurality of transitions between the voltage values (in the example illustrated two values "Vbus", "gnd") is present on the communication bus 1.

Figure 1A:
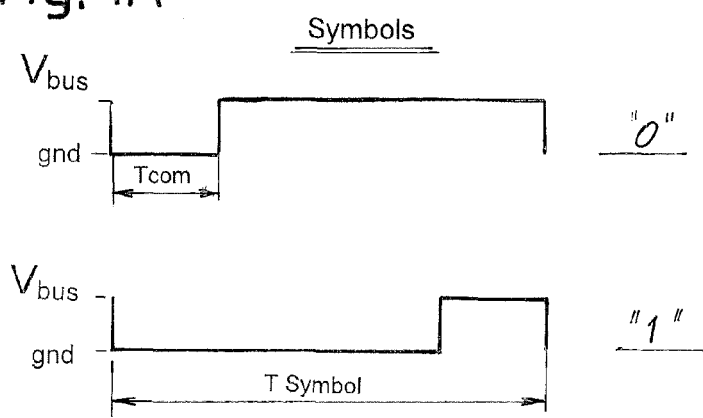
FIG. 1A shows an example of symbols of a data transmission protocol on the communication channel of FIG. 1.

Data transmission takes place with a given transmission frequency, which can be fixed or variable as a function of the type of devices connected, the condition of the communication channel or other parameters. The transmission frequency is the frequency with which the single information bits are transmitted. A combination of several transmission bits forms a symbol. Purely by way of example, FIG. 1A shows two symbols, defined as "1" and "0", which can be used to communicate information on the communication channel 1. Each symbol is formed by a sequence of a given number of bits. Each bit has a duration $T_{COM}$ while each symbol has a duration equal to a multiple of the duration of one bit. In the example illustrated, the duration symbol of a symbol is 4 $T_{COM}$, as each symbol is formed of four bits. The symbol defined as "1" is constituted by a first bit during which the voltage on the communication channel is equal to the low value "gnd" and three bits during which the voltage is at the high value "Vbus". Conversely, the symbol "0" is encoded as sequence of four bits, the first three of which are at the low value "gnd" and the last at the high value "Vbus". It may be understood that various other symbols can also be provided, defined by other sequences of bits and that other transmission protocols can also be provided, in which each symbol is constituted by a sequence of bits of a length other than the one shown.

Transmission frequency is defined as the inverse of the duration of an information bit, therefore $f_{COM}=1/T_{COM}$. Symbol frequency ($f_{SYMBOL}$) is defined as the inverse of the duration $T_{SYMBOL}$ of a symbol. Therefore, in the example illustrated, the communication frequency is equal to $f_{COM}=4 f_{SYMBOL}$.

The single devices D1, D2, ... Dn must phase their internal clock to the data stream on the communication channel 1 to be able to dialog correctly on the communication channel 1. The clock frequency must be set as a function of the transmission frequency. The phase of the clock signal must allow the device to "lock" the phase of the data stream transmitted on the transmission channel to allow both data recovery, i.e. correct sampling and consequently correct interpretation of the data, and correct transmission of information from the device to the communication channel.

In general, the internal clock of a generic device D1 has a frequency substantially equal to the communication frequency or to a multiple of the frequency. In the example disclosed here, a clock frequency equal to the value of the communication frequency is advantageously provided. This clock frequency is the lowest admissible for an operation of locking and recovery of the signal on the communication channel, to the advantage of limiting computational complexity. The phase of the clock signal must be locked to the phase of the data stream on the channel 1, i.e. each device D1, D2, . . . Dn that must communicate through the channel 1 must have its own clock synchronized with the data stream on the channel.

"Synchronized" is intended in general as a signal that has a desired phase shift with respect to the data stream, not necessarily a phase shift equal to zero.

To allow a generic device D1 to perform clock recovery and data recovery, according to an embodiment of the present invention the device is provided with a phase detector circuit, shown schematically in FIG. 2 and indicated as a whole with 3, which supplies in the manner described below an input signal for a PLL.

The phase detector circuit 3 includes a sample-and-hold circuit 5 with an input 5A for the signal to be sampled. An input B of a phase comparator 7 is connected to the output of the sample-and-hold circuit 5. The phase comparator 7 has a further input A and an output Y. When the PLL has "locked" the data stream on the communication channel 1, on the output of the sample-and-hold circuit there is present a sampled signal, which recovers the data stream on the communication channel 1 and which has a delay with respect to the data stream (i.e. a phase shift) of predetermined value. This delay can be zero or different from zero and is typically equal to a fraction of the duration of the bit period ($T_{COM}$) of the signal present on the channel 1.

The data stream coming from the communication channel, indicated in FIG. 2 as "bus signal", is applied to the input A of the phase comparator 7 and to the input 5A of the sample-and-hold circuit 5.

The sample-and-hold circuit 5 is controlled by the clock signal CLK of the device, for example generated by a digital phase-controlled oscillator. As indicated above, the clock signal CLK has a frequency typically equal to the communication frequency on the communication channel 1. Therefore, a digital signal representing the recovery of the signal present on the communication bus 1 is present on the output of the sample-and-hold circuit 5. The phase shift between the bus signal and the recovered signal depends on the phase of the clock signal.

Schematically, block 5, which represents the sample-and-hold circuit, includes in a manner known in the art an electronic switch 11 (for example a MOSFET), whose closing and opening is controlled by the clock signal CLK. Closing of the electronic switch 11 places the input 5A of the sample-and-hold circuit in communication with a capacitor 13 and the non-inverting input of an operational amplifier 15 whose inverting input is connected to the output of the amplifier. The amplifier 15 functions as an output buffer.

In this embodiment, the phase comparator is formed by an exclusive OR (X-OR) logic gate. The truth table of this logic gate is, as it is known, the following:

| A | B | Y |
|---|---|---|
| L | L | L |
| L | H | H |
| H | L | H |
| H | H | L |

L and H are two generic digitalized levels that the signals on the inputs A and B of the gate can take. The output of the gate is "H" only if the input signals are different from each other. In the case in question, L and H indicate the two levels that the signal on the communication bus 1 can take, for example L can be the low value ("gnd") and H the high value ("Vbus") of the bus voltage.

FIG. 3 shows the shape of the signal on the inputs A and B and on the output Y of the phase comparator 7, in which A is the signal coming from the communication bus 1, B is the sampled signal, i.e. the signal recovered from the sample-and-hold circuit 5, Y is the output signal of the phase comparator 7, and CLK is the clock signal on the basis of which sampling is performed. Sampling takes place at each rising edge of the CLK signal. Starting from the generic instant $t_0$, in which the signal on the bus 1 (input A of gate 7) and the sampled signal (input B of gate 7) are both low (level L), the output Y of the X-OR gate is low (L) and is maintained at this value until the subsequent rising edge of the signal on the bus (input A), at the instant $t_1$. At this rising edge, the output signal Y of the X-OR gate 7 goes to the high value (H) as the two inputs A and B are different from each other. This high value of the output Y is maintained until the subsequent sampling instant $t_2$, which coincides with the rising edge of the clock signal CLK.

At the instant $t_2$ the output signal Y returns to low, as the signal on the first input A (bus signal) and the signal on the second input B (sampled signal) have the same high value, resulting from the sample-and-hold operation. The subsequent rising edge of the output signal Y is obtained at the instant $t_3$, when the bus signal on the input A goes to the low value, while the signal on the input B is maintained high by the sample-and-hold signal 5. The subsequent sampling instant is obtained at the instant at the subsequent rising edge of the clock signal CLK, coinciding with which the signal Y has a falling edge, and so forth.

In the diagram of FIG. 3 the finite time required for each transition of the signal has been ignored and an ideal situation has been represented, in which signal level transition is instantaneous both at the rising edge and at the falling edge of the signal.

In the case in which the input signals at the X-OR gate 7 have the same pattern and the same period, and if there is no coincidence between rising edges and falling edges of the two signals, it is easy to understand from the diagram of FIG. 3 that the duration of the high part ("H") of the output signal Y corresponds to the delay, i.e. the phase shift between the signals A and B. In other terms, by sampling the data stream on the bus 1 with a sampling frequency equal to the transmission frequency and applying the bus signal and the sampling signal to the two inputs A and B of the phase comparator 7, the phase shift between the two signals equal to T_delay (FIG. 3) is given by the time interval during which the output signal Y of the X-OR gate takes a high value (H).

Therefore, the output signal Y of the phase detector circuit is such that the duration of the high pulse (H) is equal to the phase shift between the bus signal (and therefore the data stream on the bus 1) and the digital signal recovered by the sample-and-hold circuit 5.

Figure 5:
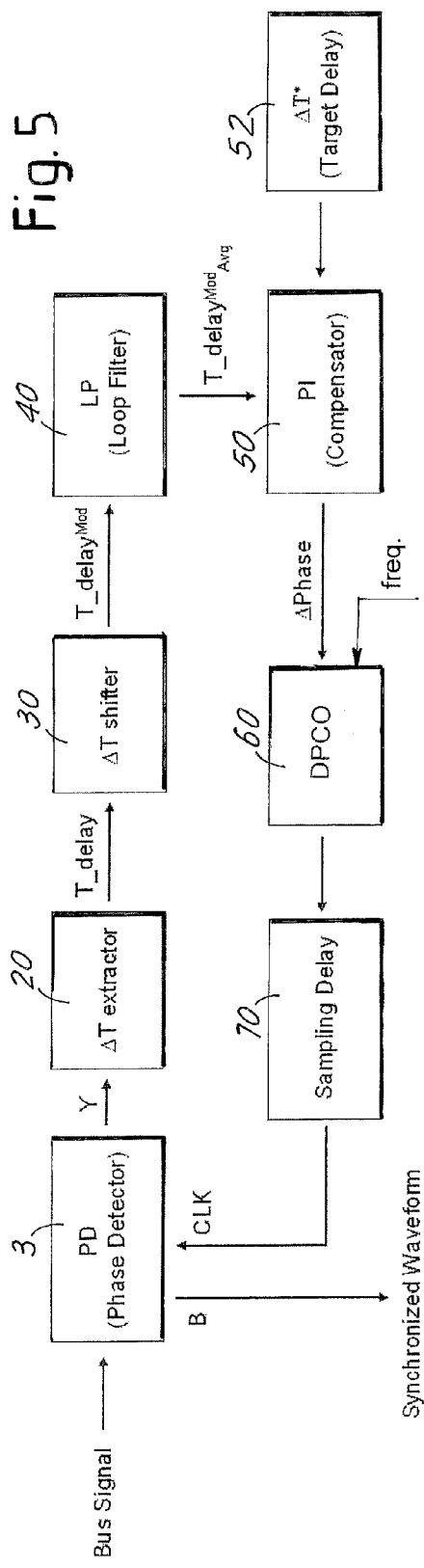
FIG. 5 is a block diagram of the PLL circuit according to an embodiment of the invention, in which the phase detector circuit of FIG. 2 is inserted.
Figure 6:
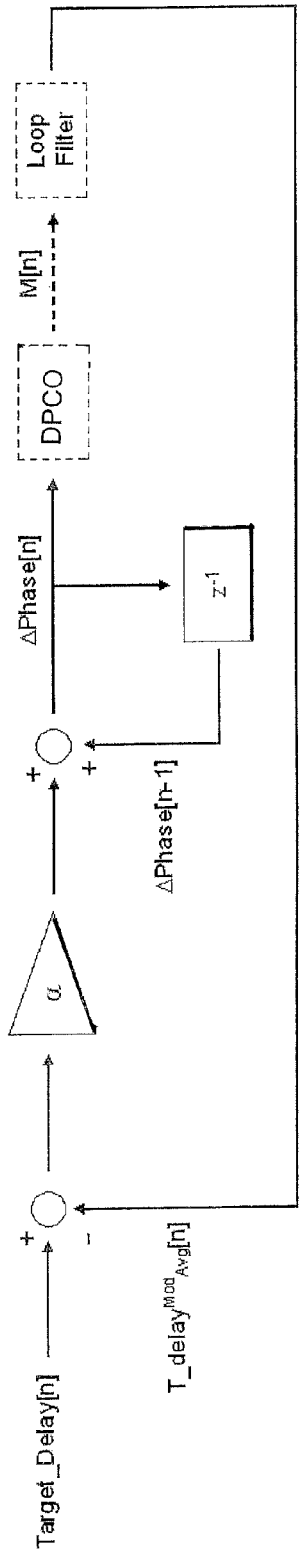
FIG. 6 shows the topology of the proportional-integral compensator of the PLL circuit of FIG. 5.

The phase detector circuit 3 forms part of a PLL circuit, in which the output signal of the phase comparator 7 is used as phase error signal. The PLL circuit, hereinafter described with reference to FIGS. 5 and 6, is designed to make the phase error signal converge toward a desired phase shift value between the data stream and the signal sampled by the sample-and-hold circuit 5. This is obtained by acting on the phase of the clock signal generated by the oscillator of the PLL circuit.

The phase detector circuit 3 has an important property that can be expressed as follows: a falling transition edge (i.e. from the high value to the low value) of the output signal Y of the phase detector signal 3 always coincides with a rising transition edge of the clock signal CLK.

This property can be demonstrated simply through a proof ad absurdum. A falling transition of the output signal Y is obtained only in concurrence with the following four conditions:

1. (A,B)=(L,H)→(A,B)=(L,L)
2. (A,B)=(H,L)→(A,B)=(L,L)
3. (A,B)=(H,L)→(A,B)=(H,H)
4. (A,B)=(L,H)→(A,B)=(H,H)

where A, B, L, H have the meanings defined above. Demonstration of the property expressed above for the first condition is as follows, with reference to FIG. 4. FIG. 4 shows the signal A which remains low (L), the signal B which switches from high (H) to low (L), and the consequent falling transition edge, i.e. the falling edge of the output signal Y of the phase comparator. The three graphs below (indicated with CLK="H", CLK="L" and CLK="↓") represent three absurd conditions, i.e. that cannot occur in coincidence with the falling transition of the signal Y. In fact, in the situation considered, the falling edge (falling transition) of the output signal Y is determined by a variation (falling transition) of the sampled signal. As a transition of the sampled signal cannot occur in concurrence with a sampling instant, and as it has been stated that sampling takes place at a rising transition of the CLK signal, the three conditions represented in FIG. 4 are absurd, as sampling of the signal A, and consequently a variation of the sampled signal B, does not occur in any of these conditions.

A similar demonstration can be obtained for the remaining three conditions.

This property is important for the purposes of calculating the duration of the high pulse of the output signal Y. In fact, it allows the use of a time calculation mode called Gated Count Mode.

With reference to the block diagram of FIG. 5, the remaining functional blocks of the PLL circuit will now be described according to an embodiment of the invention.

Starting from the output signal Y of the phase detector circuit, it is first necessary to calculate the delay time, i.e. the phase shift between the bus signal A and the sampled signal B, this delay being defined by the time interval during which the signal Y remains high. This duration is calculated through a block 20 defined as time interval extractor block, indicated as ΔT extractor in the block diagram of FIG. 5. In substance, it is a digital timer, whose function is that of extracting a time value from the input signal. A free running timer, which is sampled by the control algorithm at a fixed frequency, can be used for this purpose. It can use, for example, a count mode called "Gated Count Mode" or a count mode called "Input Capture Mode". The first mode is preferred. In this mode the timer is started when the input signal makes a rising transition and the count is sampled at the falling transition of the signal Y. On the basis of the properties demonstrated above, according to which a falling edge (high-low transition) of the signal Y coincides with a rising edge of the clock signal CLK, the timer can be controlled by software through the clock signal CLK. This property allows resetting of the time measured at each rising edge of the clock signal also in the absence of synchronism.

In this way, a simple and robust method is obtained to determine the high input signal amplitude, which represents the time delay to be calculated. Conversely, the Input Capture Mode counts the time between two edges of an input signal. This count mode can also be used, as it is the time between two consecutive edges (rising and falling respectively) of the output signal Y of the phase detector circuit 3 that must be measured.

In any case, whatever of the count mode used, the output of the block 20, indicated with T_Delay in the block diagram of FIG. 5, is a digital measurement of the time duration of the interval during which the signal Y is at the high value, time that corresponds to the phase shift between the bus signal and the sampled signal.

This time value is sent to a delay shifter block 30, called "time interval shifter" or ΔT Shifter. The function of this block is as follows: if the value T_Delay calculated by the block 20 is between 0 and $T_{CLK}/2$ (where $T_{CLK}$ is the clock time) the delay T_Delay calculated by the block 20 remains unchanged. If the delay T_Delay is between $T_{CLK}/2$ and $T_{CLK}$, its value is translated by $T_{CLK}$. The output signal, indicated with T_Delay$^{Mod}$, from the block 30 is therefore defined as follows:

$$T\_Delay^{Mod} = \begin{cases} T\_Delay & \text{if } 0 \le T\_Delay \le \frac{T_{CLK}}{2} \\ T\_Delay - T_{CLK} & \text{if } \frac{T_{CLK}}{2} < T\_Delay \le T_{CLK} \end{cases}$$

This translation allows all points in the interval $[0; T_{CLK}]$ to be made stable for convergence with the exception of the point $T_{CLK}/2$ which becomes an unstable equilibrium point for the phase lock algorithm. In particular, the point "0" will become stable. This point will in general be preferred as convergence point of the algorithm in its practical embodiments. Other translation functions can be used as an alternative to the one indicated above, but in this case the unstable balance point will be different from the central point $T_{CLK}/2$.

The signal T_Delay$^{Mod}$ is filtered in a filter block LP (Loop Filter) indicated with 40, which will be described below. The output signal from the filter, indicated with T_Delay$^{Mod}_{Avg}$ is supplied to a proportional integral compensator PI, indicated with 50. This block is constituted by a digital proportional-integral compensator in the domain Z and supplies a DPCO (Digital Phase-Controlled Oscillator) 60 with a signal that represents a phase variation (Δphase) to obtain phase locking of the clock signal to the data stream on the communication channel 1.

The proportional integral compensator 50 can have the structure represented by the block diagram of FIG. 6. The PI compensator receives the input signal T_Delay$^{Mod}_{Avg}$ and a desired phase shift value between the clock signal and the data stream. This desired phase shift is indicated as "Target_Delay" and is supplied by a block 52. As will be explained below, this desired delay can be 0 (i.e. the sampled signal is in phase with the data stream on the communication channel). In other embodiments the delay can typically be between 0 and $T_{CLK}/2$, for example can be equal to $T_{CLK}/3$.

The difference between the Target_Delay value at the step n of the algorithm (Target_Delay[n]) and the value T_Delay$^{Mod}_{Avg}$ at the step n (T_Delay$^{Mod}_{Avg}$[n]) is multiplied by a gain constant and added to the value of the phase variation calculated at the preceding step (n−1) to obtain the value of the phase variation (Δphase[n−1]) at the current step [n] of the control algorithm. This value (Δphase[n]) is supplied to the control input of the oscillator 60.

The value of the gain constant α is chosen on the basis of some considerations on the closed loop transfer function of the PLL. The following relations apply:

$$\begin{cases} \text{T\_delay}^{MOD}\text{Avg}[n] = M[n] \otimes h_{LPF}[n] \\ M[n] = \Delta\text{Phase}[n-1] \\ (\text{Target\_Delay}[n] - \text{T\_delay}^{MOD}\text{Avg}[n]) * \alpha + \\ \Delta\text{Phase}[n-1] = \Delta\text{Phase}[n] \end{cases}$$

where $h_{LPF}[n]$ represents the response of the filter 40 to the pulse and will be described subsequently and the symbol $\otimes$ indicates the convolution operation.

The transfer function of the LP filter can vary according to how this filter is configured. In the most simple hypothesis, of missing filter, then $$h_{LPF}[n]=1$$

and the filtered delay is equal to M[n]. In this case, the transfer function in the Z domain is given by $$H(z) = \frac{M(z)}{\text{Target\_Delay}(z)} = \frac{\alpha}{1-(1-\alpha)*a^{-1}}$$

and the time response of the system is given by $$M[n]=\text{Target\_Delay}[n]+\alpha(1-\alpha)^n$$

It can easily be seen that in this case there is a single pole in $z=1-\alpha$ which is asymptotically stable for $0<\alpha<1$.

The block 60 is a square wave generator that has two inputs and one output. The first input supplies the square wave frequency that must be generated. The second input is a phase input and comes from the block 50. The output of the block 60 is the clock signal CLK that controls the sample-and-hold circuit 3.

It must be noted that to be able to correctly implement this block inside the synchronization algorithm, it is necessary to perform a preliminary estimation of the transmission frequency of the signal on the communication channel 1. This can be easily performed using a counter that measures the time period of the signal on the communication channel 1. The frequency of the clock signal CLK is advantageously set equal to the value of the transmission frequency.

Advantageously, in an embodiment of the invention, a sampling delay is also applied, through the block 70, to the clock signal generated by the digital voltage controlled oscillator 60. This takes account of the fact that the signal transitions on the communication channel are not instantaneous, but each rising edge and each falling edge of the signal is characterized by a finite transition time of the signal from the low value to the high value and vice-versa. These transition times are determined by the parasitic capacitances of the communication channel and by the active and passive noise filters present on the channel.

Indicating with $T_{RISE}$ and $T_{FALL}$ the durations of the rising and falling edges of the signal respectively, the maximum between the times of the rising and falling edges of the signal on the communication channel is defined as $$T_{BUS}=\max(T_{RISE};T_{FALL})$$

This time $T_{BUS}$ is added to the sampling signal generated by the PLL circuit, so that sampling is always carried out after the signal has completed the rising or falling edge.

Figure 7:
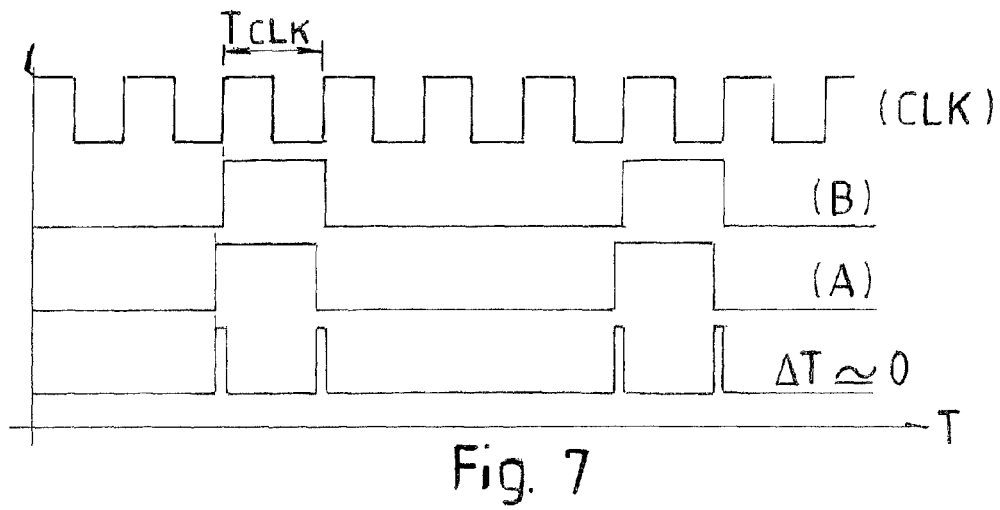
Figure 8:
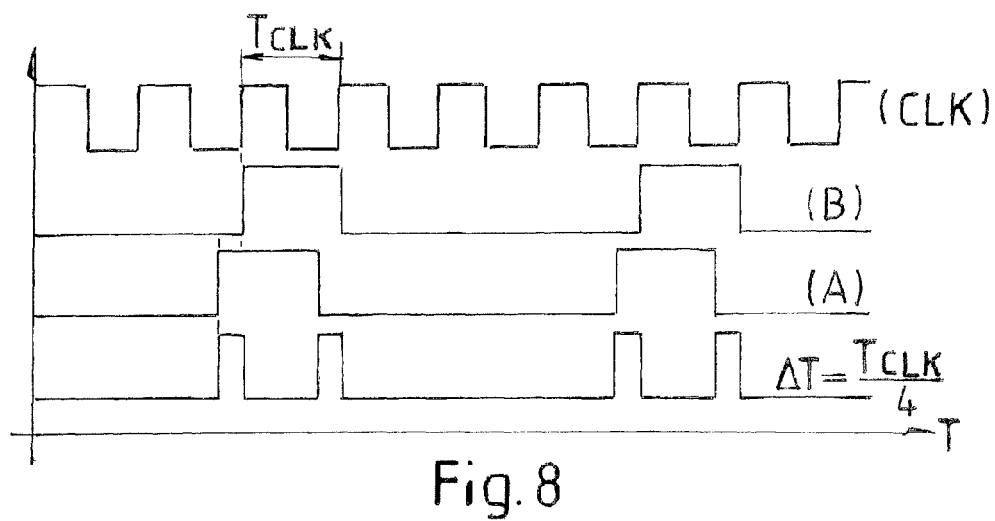
FIGS. 8 and 9 show waveforms of the data stream on the transmission channel and of the data recovered from the PLL circuit according to the invention in three different operating conditions.
Figure 9:
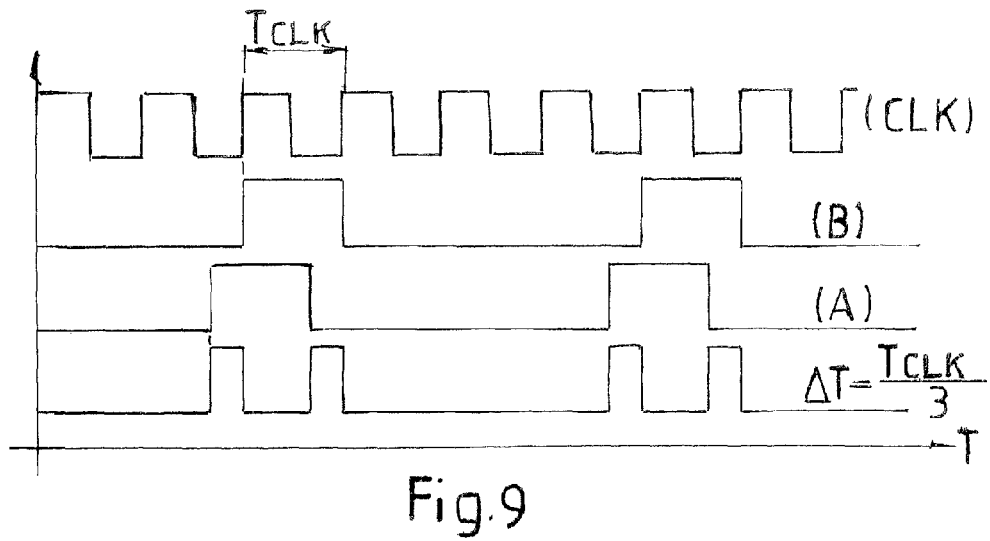

FIGS. 7 to 9 show the waveforms of the communication signal on the bus, of the recovered signal, of the clock signal and of the delay between the bus signal and the recovered signal in three different operating conditions. In each diagram, A indicates the bus signal, i.e. the data stream on the communication bus 1. B indicates the signal recovered through the PLL circuit described above. CLK indicates the clock signal and ΔT indicates the delay between the signals A and B. When the PLL circuit has locked the bus signal, the delay ΔT is equal to the desired delay (Target_Delay) set by the block 52.

The diagram of FIG. 7 shows the waveforms in the case of Target_Delay=0. It must be observed that the real delay ΔT between the two signals A and B is not in actual fact equal to zero, but rather to a finite, albeit very small, value and is due to the calculation time required to perform the control algorithms of the present invention which cannot be eliminated.

FIG. 8 shows the waveforms in the case of a set delay between the signals A and B equal to $T_{CLK}/4$, i.e. to a quarter of the clock period, while FIG. 9 shows the same waveforms with a set delay equal to $T_{CLK}/3$.

In FIGS. 7 to 9 it can be seen that the rising edge of the CLK signal is shown coincident in time with the rising edge of the sampled signal (B). This is a theoretical situation. In practice, there will be a slight delay between the CLK signal and the sampled signal B, due to the processing times.

Thus, although there have been described particular embodiments of the present invention of a new and useful Method and Circuit for Clock Recovery of a Data Stream Description it is not intended that such references be construed as limitations upon the scope of this invention except as set forth in the following claims.

What is claimed is:

1. A method for clock recovery and data recovery from a data stream on a communication channel, comprising the steps of:
    sampling a data stream on the communication channel at a sampling frequency determined by a clock signal and generating a sampled signal;
    determining a phase shift between the communication data stream and the sampled signal;
    modifying the phase of the clock signal on the basis of the phase shift, to obtain a desired phase difference between the sampled signal and the data stream;
    wherein determining the phase shift between the sampled signal and the data stream comprises applying the sampled signal and the data stream to two inputs of a phase comparator that supplies an output phase shift signal; and
    wherein the phase shift signal is applied to a calculation block of a delay time between two edges of the phase shift signal, to supply a signal that is a function of the delay time.

2. The method of claim 1, wherein the data stream is sampled at a predetermined point of the clock signal.

3. The method of claim 1, wherein the data stream is sampled through a sample-and-hold circuit.

4. The method of claim 1, wherein the data stream is sampled at the rising edges of the clock signal.

5. The method of claim 1 further comprising:
    estimating a transmission frequency of the data stream; and
    wherein the frequency of the clock signal is set as a function of the transmission frequency of the data stream.

6. The method of claim 1,
    wherein the phase shift signal is generated by applying the data stream and the sampled signal to the inputs of an exclusive OR logic gate; and
    wherein the phase shift signal is determined by the output signal of the logic gate.

7. The method of claim 1, wherein the clock signal is modified as a function of the phase shift signal.

8. The method of claim 1, wherein a signal that is a function of the delay time is applied to a compensator whose output modifies the phase of the clock signal so that the difference in phase between the sampled signal and the data stream converges toward the desired phase difference.

9. The method of claim 8, wherein the compensator comprises a proportional-integral compensator.

10. The method of claim 8, wherein the output of the compensator is applied to a clock signal generator.

11. The method of claim 10, wherein a signal indicating the desired difference in phase between the sampled signal and the data stream is applied to the clock signal generator.

12. The method of claim 10, wherein the output of the clock signal generator is applied to a sampling delay block and the output of the delay block is used to control sampling of the data stream.

13. A circuit for clock recovery and data recovery from a data stream on a communication channel, the circuit comprising:
- a PLL circuit comprising an oscillator configured to generate a clock signal at a clock frequency;
- a phase detector circuit comprising
    - an input configured to receive the data stream at a communication frequency;
    - a sample-and-hold circuit configured to be controlled by a sampling signal at a sampling frequency;
    - a phase comparator having a first input configured to receive the data stream and a second input to which a signal sampled by the sample-and-hold circuit is applied, the phase comparator effective to output a phase signal that is a function of the phase difference between the data stream and the sampled signal;
- wherein the PLL circuit is effective to generate a control signal for the oscillator, on the basis of the phase signal, the control signal being such as to make the phase difference between the sampled signal and the data stream converge toward a desired phase difference; and
- wherein the PLL circuit comprises a time interval extractor block effective to determine the duration of the phase signal, to an input of which the phase signal is applied.

14. The circuit of claim 13, wherein the sampling frequency is a function of a communication frequency.

15. The circuit of claim 13, wherein a time interval shifter block is associated with the time interval extractor block.

16. The circuit of claim 13, wherein the PLL circuit comprises a proportional-integral compensator, the proportional-integral compensator having an input configured to receive a signal that is a function of the phase signal and having an output configured to supply a phase variation signal that modifies the phase of the clock signal of the oscillator.

17. The circuit of claim 16, further comprising a sampling delay block functional to impose a delay on the sampling signal as a function of the maximum level transition time of the data stream.

\* \* \* \* \*